United States Patent
Nirschl et al.

(10) Patent No.: US 7,580,297 B2
(45) Date of Patent: Aug. 25, 2009

(54) READOUT OF MULTI-LEVEL STORAGE CELLS

(75) Inventors: Thomas Nirschl, Essex Junction, VT (US); Jan Otterstedt, Unterhaching (DE)

(73) Assignee: Infineon Technologies AG, Munich (DE)

( * ) Notice: Subject to any disclaimer, the term of this patent is extended or adjusted under 35 U.S.C. 154(b) by 111 days.

(21) Appl. No.: 11/731,766

(22) Filed: Mar. 30, 2007

(65) Prior Publication Data
US 2008/0239833 A1 Oct. 2, 2008

(51) Int. Cl.
*G11C 16/04* (2006.01)
(52) U.S. Cl. .................. 365/189.07; 365/189.09; 365/210.1; 365/207
(58) Field of Classification Search .......... 365/189.07, 365/189.09, 210.01, 297, 185.21, 221; 327/530, 327/535–536
See application file for complete search history.

(56) References Cited

U.S. PATENT DOCUMENTS

| | | | |
|---|---|---|---|
| 5,796,273 A | 8/1998 | Jung et al. | |
| 7,142,464 B2 * | 11/2006 | Dadashev | 365/189.09 |
| 7,324,381 B2 * | 1/2008 | Gallo et al. | 365/185.21 |
| 2003/0214867 A1 | 11/2003 | Goldman et al. | |
| 2006/0002172 A1 | 1/2006 | Venkataraman et al. | |

FOREIGN PATENT DOCUMENTS

EP  0 744 753 A2  11/1996

* cited by examiner

*Primary Examiner*—David Lam
(74) *Attorney, Agent, or Firm*—Slater & Matsil, L.L.P.

(57) ABSTRACT

A multi-level sensing scheme compares the state of a multi-level storage cell with monotonously changing reference states, which are associated to different information values. That particular information value is identified to be the information stored in the multi-level storage cell, which has associated that reference state which, in a changing direction, firstly exceeds the state.

12 Claims, 5 Drawing Sheets

READOUT OF MULTI-LEVEL STORAGE CELLS

TECHNICAL FIELD

The present invention relates to the readout of multi-level storage cells or multi-level storage devices.

BACKGROUND

Sensing schemes are used for volatile and non-volatile memories implementing multi-level storage within one memory cell. Such a multi-level storage may have more than two states, i.e., more than two information values may be stored within the cell. Therefore, multi-level storage is a promising option to reduce the effective (semiconductor) area per bit. The principle is, for example, applicable to floating-gate memory cells or for other non-volatile memory cells like phase-change memories (PCRAM), conducting-bridge memory (CBRAM), threshold switching memories, metal-oxide based memories or NROM memories. As the different storage techniques make use of different physical effects to store information, the general term "state" shall in the following describe the different possible physical properties of materials to store information. Therefore, the term "state" may describe different orientations of magnetic domains or different magnetic moments as well as different crystalline structures (amorphous, mono-crystalline or mixtures of both), different refraction indices of materials, different resistances of a material or the like. A state may also be one of different charges stored on a capacitor. It is going without saying that the above list is not final. Embodiments of the present invention may therefore also be applied to any forthcoming technique allowing to store/preserve more than two states, exploiting a physical property of a material or circuit technique.

Generally, when sensing stored information, reliability and energy consumption is an issue. Sensing multiple possible stored states (information values) in parallel requires a lot of silicon real estate and power, since a detection circuit must be present for each possible state. Especially with memory arrays having large word-sizes (bit-lines to be readout in parallel), a standard architecture using n−1 sense amplifiers to sense n possible stored levels or states, is no longer feasible. Each individual sense amplifier would have to be accurately adjusted to distinguish between different levels and to apply precisely the same thresholds than the corresponding sense amplifiers of the other bit-lines. This would furthermore result in sensing circuits which waste large areas of silicon on an integrated device.

SUMMARY OF THE INVENTION

In one embodiment of the present invention, a multi-level sensing scheme is used to compare the state of a multi-level storage cell with monotonously changing reference states, which are associated to different information values. That particular information value is identified to be the information stored in the multi-level storage cell, which has associated that reference state which, in a changing direction, firstly exceeds the state.

In other words, according to an embodiment of the present invention, the state of a storage cell is sequentially probed by monotonously changing reference states.

BRIEF DESCRIPTION OF THE DRAWINGS

Embodiments of the present invention will in the following be elaborated in more detail, referencing the enclosed figures.

DETAILED DESCRIPTION OF ILLUSTRATIVE EMBODIMENTS

In the following paragraphs, several embodiments of the present invention will be described referencing the enclosed figures.

Figure 1:
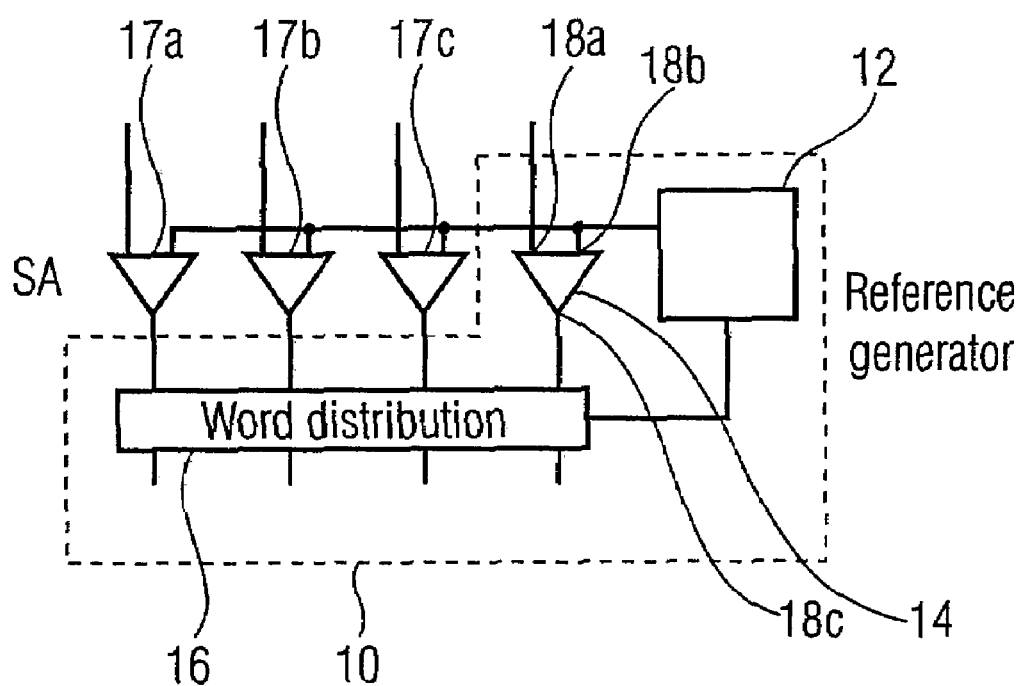
FIG. 1 shows an embodiment of an inventive apparatus for sensing information of a multi-level storage cell.

FIG. 1 shows an embodiment of an apparatus or a sense circuit sensing information stored as a state of a multi-level storage cell having more than two possible states. The sense circuit 10 comprises a signal ramp generator 12, a comparator 14 and an output circuit 16. FIG. 1 further shows additional comparators 17a-17c, which can be implemented for a parallel readout of multiple multi-level storage cells. The functionality of the additional comparators 17a-17c is identical to the functionality of comparator 14. Therefore, the embodiment of FIG. 1 will in the following be described with respect to comparator 14 only.

Figure 3:
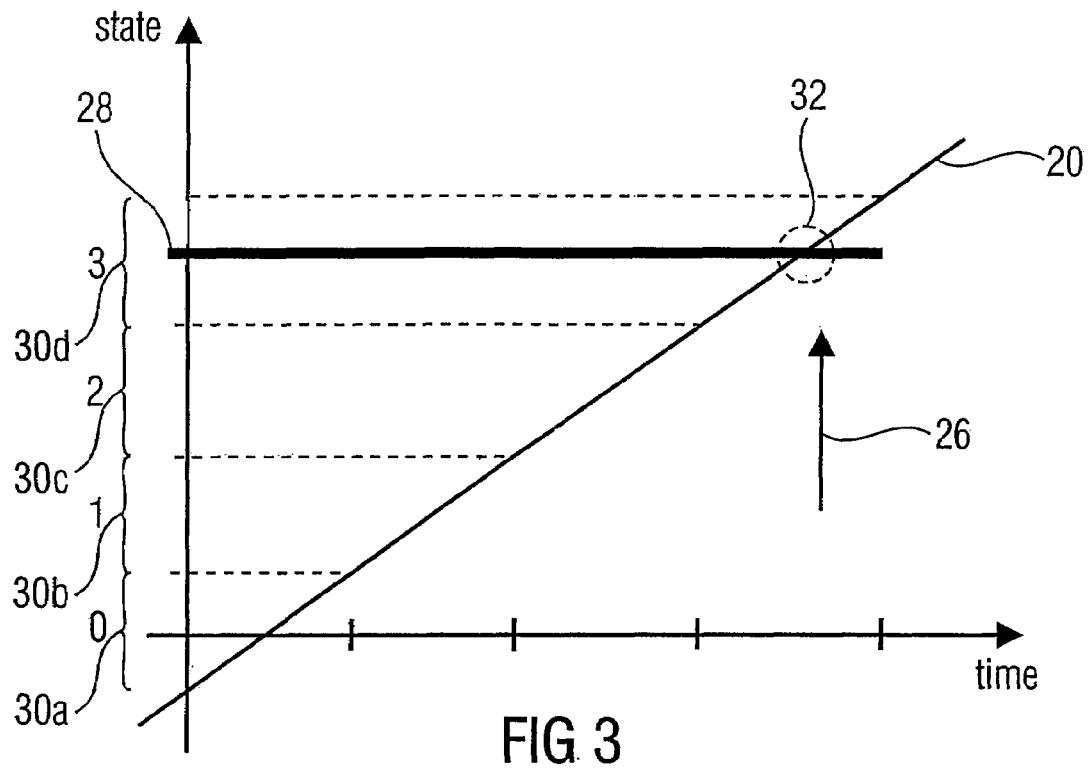
FIG. 3 shows an example of the inventive generation of reference states.
Figure 4:
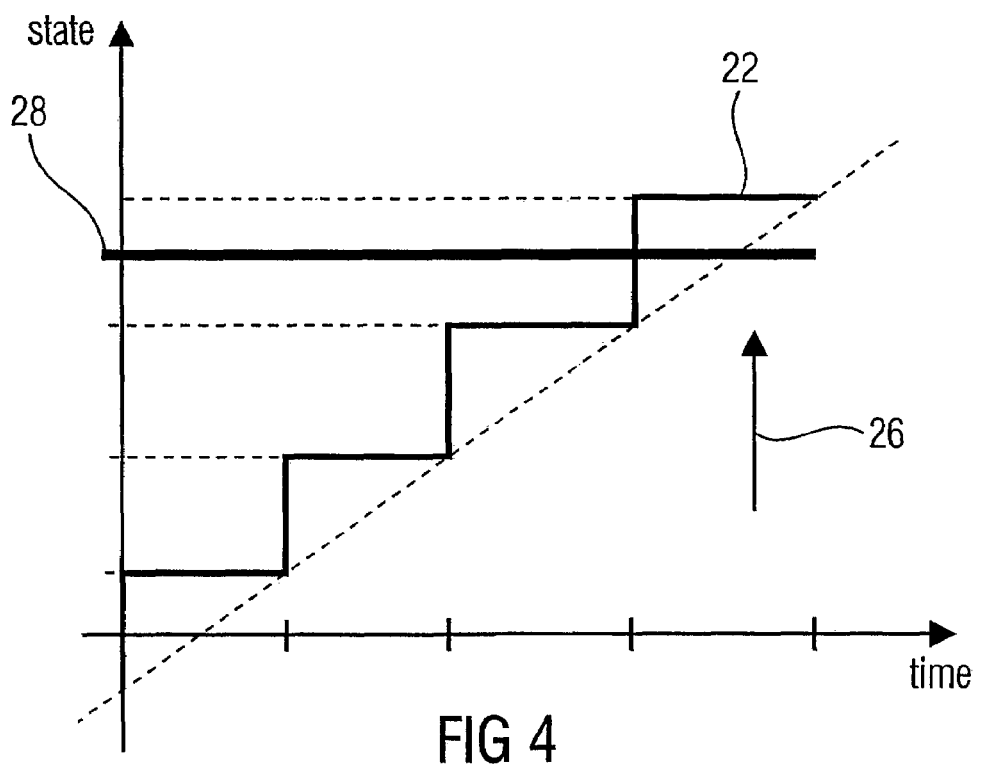
FIG. 4 shows a further example of the inventive generation of reference states.
Figure 5:
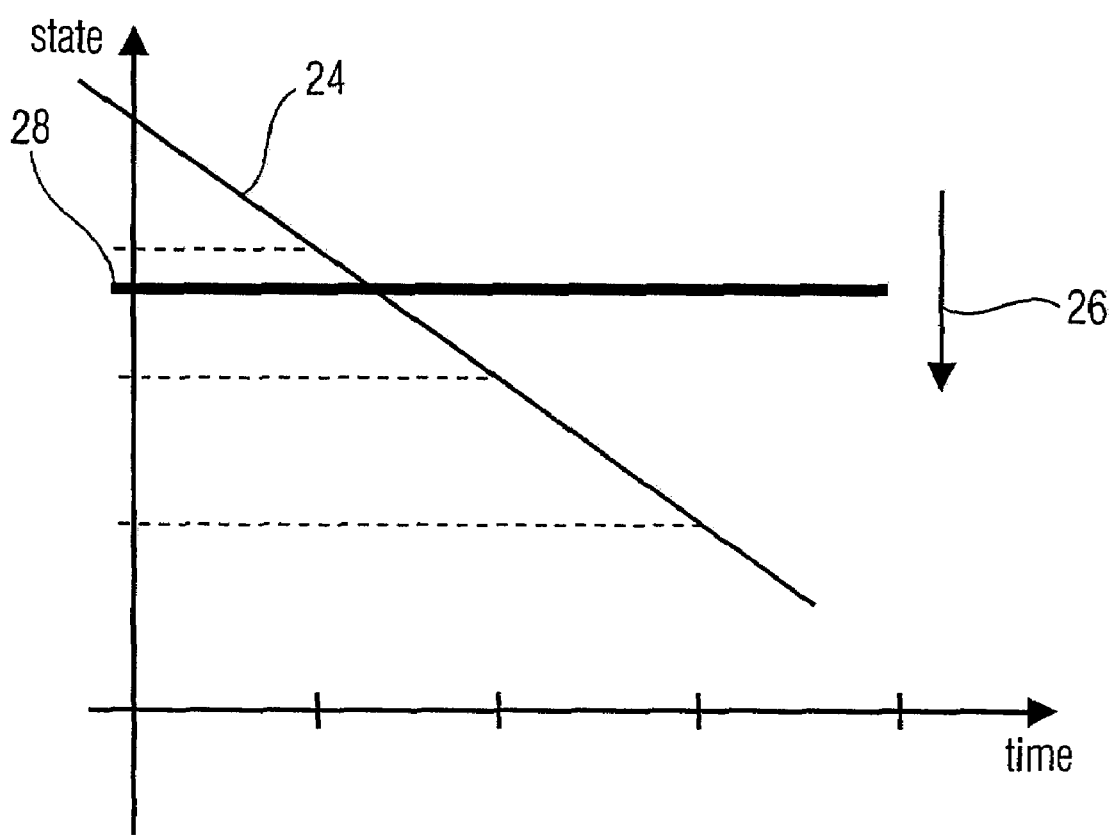
FIG. 5 shows a further example of the inventive generation of reference states.

The comparator 14 has a first comparator input 18a for receiving a state of a multi-channel storage cell and a second comparator input 18b for receiving a reference state. The reference state is generated by signal ramp generator 12, such that the reference state changes monotonously in a changing direction. Different ways for generating appropriate reference states are shown in FIGS. 3-5. Therefore, wherever appropriate, reference will in the following be made to one of these figures to explain the inventive concept.

A comparator output 18c of comparator 14 is connected to the output circuit 16, which furthermore receives input from the signal ramp generator 12, which generates the reference states and different information values associated to the reference states. Generally, a stored state (level) is detected by sweeping the reference state (which could, for example, be a current, voltage, or a gain setting of an amplifier) in a discrete or continuous fashion, as, for example, shown in FIGS. 3-5.

FIGS. 3-5 show the time in arbitrary units on the X-axis and the state in arbitrary units on the Y-axis. FIG. 3 shows the generation of a continuous monotonously changing reference state 20 whereas FIG. 4 shows reference states 22, which are generated as a series of monotonously changing discrete reference states. FIG. 5 shows another possibility of generating monotonously changing reference states 24, which are generated in an order of decreasing magnitude. However, all reference states generated have in common, that they are changing continuously in a changing direction 26.

As an example of a possible state applied to the first comparator input 18a, FIGS. 3-5 illustrates a state 28 to be sensed.

In more general terms, FIGS. 3 and 5 show reference states being a monotonously changing function of possible states of the multi-level storage cell, wherein both reference states are changing in a changing direction. However, the changing direction in FIG. 3 is such, that the reference states are generated with increasing magnitude, whereas in FIG. 5 the reference states are generated with decreasing magnitude.

It goes without saying that, although linear generation of reference states is shown in FIGS. 3 and 5, monotonously changing reference states may also be generated depending non-linearly from time. The reference states used may thus be chosen to ideally fit the storage technique which is to be read out. Also, a comparison may not take place continuously with time but at specific sample points, which could, for example, be generated by an external or internally generated clock signal.

In the embodiment of FIG. 1, the reference state is generated by a counter. The counter counts from zero up to the maximum number of possible states and additionally generates monotonously changing reference states that have associated thereto the counter values. In this particular embodiment the counter values are integer numbers. The associated information value or counter value is supplied to the output interface. When the reference state, which firstly exceeds the state, is supplied to the second comparator input 18b of comparator 14, an output signal is generated at the output 18c of the comparator, which indicates that property of the actual reference state. On occurrence of this comparator output signal, the output interface provides the information value provided by signal ramp generator 12 as the sensed information associated with the multi-level storage cell connected to comparator 14.

As previously mentioned, FIG. 1 also shows the possibility of applying additional comparators 17a-17c, which might be connected to different multi-level storage cells. Such, multiple multi-level storage cells can be readout in parallel. If, for example, 8 storage cells are readout in parallel, an 8*n-bit-word may be provided as readout. In other words, the reference state is generated by a n-bit counter, which provides the complete n-bit word for each sensed state if the reference passes the respective data signal.

With this embodiment of the present invention, only one highly accurate sense amplifier per sensed cell (e.g., bit-line) is used in conjunction with one central reference generator (signal ramp generator 12). As compared to parallel readout schemes, the inventive concept is much more efficient in that it wastes far less semiconductor surface.

Furthermore, the signal ramp generator 12 may use only one single controlled current mirror when using a current as reference state. This is highly efficient and may even increase the sensing reliability, as all bit-lines are compared with an identical reference state. Temperature compensation techniques or other signal improvement techniques can then be applied to the signal ramp generator 12, as plenty of semiconductor space is saved as compared to parallel sensing schemes.

Furthermore, the embodiment described in FIG. 1 has the great advantage, that any number of possible states or levels n can be employed. One is not restricted to use multi-level storage cells having a number of possible states which is a power of 2, that is, n≠$2^m$. Using monotonously changing reference states, as illustrated in FIGS. 3 to 5, increases the stability of operation, since no large jumps or data-dependent jumps of the reference states occurs.

Generally different information values are associated with reference states. The different information values could be integer values generated by a counter within the signal ramp generator 12. This is illustrated in FIG. 3, where intervals of possible states 30a-30d are associated to integer numbers 0-3. The output circuit outputs that information value, having associated therewith the reference state which, in the changing direction 26, firstly exceeds the state 28. In the example shown in FIG. 3, the reference state 20 exceeds state 28 at exceeding point 32. Therefore, the output interface outputs an integer value of 3 (corresponding to the interval 30d) in this particular example.

However, integer values or even monotonously increasing values are not a mandatory requirement. Arbitrary numbers may be associated to the intervals 30a-30d of FIG. 3. That is, for example, interval 30a could be associated with integer "3" and interval 30b could be associated with "0". There is furthermore no need to associate integer numbers with the reference states. That is, the reference numbers could also be floating point values.

The embodiments of the invention are also not restricted to discrete sample points or discrete sample intervals. The intervals associated with particular reference states can be decreased arbitrarily, to store an increasing number of information values associated with a state in a multi-level storage cell. Applying monotonously changing reference states may even allow the storage of an infinite number of information values, i.e., to associate floating point numbers to each infinitesimal interval of possible reference states.

As described in the particular example in FIG. 1, the signal ramp generator does, in addition to the reference states, also provide different information values, which are copied to the output circuit 16. However, the presence of an interlink between the signal ramp generator 12 and the output interface 16 is not mandatory. It is only necessary that both components share an identical association scheme, to base their operation on identical information values. For example, when the system is operated in a clocked manner, the number of clock signals may be counted by the output circuit as well as by the signal ramp generator. Once the output circuit 16 knows, when a readout operation begins, i.e., when the signal ramp generator starts to generate reference states, the information value output could simply be derived by counting the number of clock signals from the beginning of the readout operation.

According to a further embodiment of the present invention, only one single comparator or sense amplifier for comparison of the state and the reference states is required. This results in a sensing scheme requiring only minimum amount of power and furthermore allowing a read out with only small area consumption within the integrated circuit. When, for example, reading out multiple multi-level storage cells in parallel (wide word storage), the application of the inventive concept leads to a strong decrease in the power consumption and the area consumption of the readout circuits.

In a further embodiment, the inventive concept for a multi-level scheme makes use of only one signal ramp generator to generate the monotonously changing reference states for the comparison. For example, a centrally controlled reference circuit can be used for each bit-line, to serially sense the multiple levels of a multi-level storage according to this embodiment of the inventive multi-level sensing scheme.

A further embodiment of the present invention has the advantage, that any number of levels n can be sensed and stored without requiring the number n to be a power of 2 (n≠$2^m$). Furthermore, a more stable sensing can be achieved, since no large jumps or data-dependent jumps of the reference states occur, as these are changing monotonously.

Figure 2:
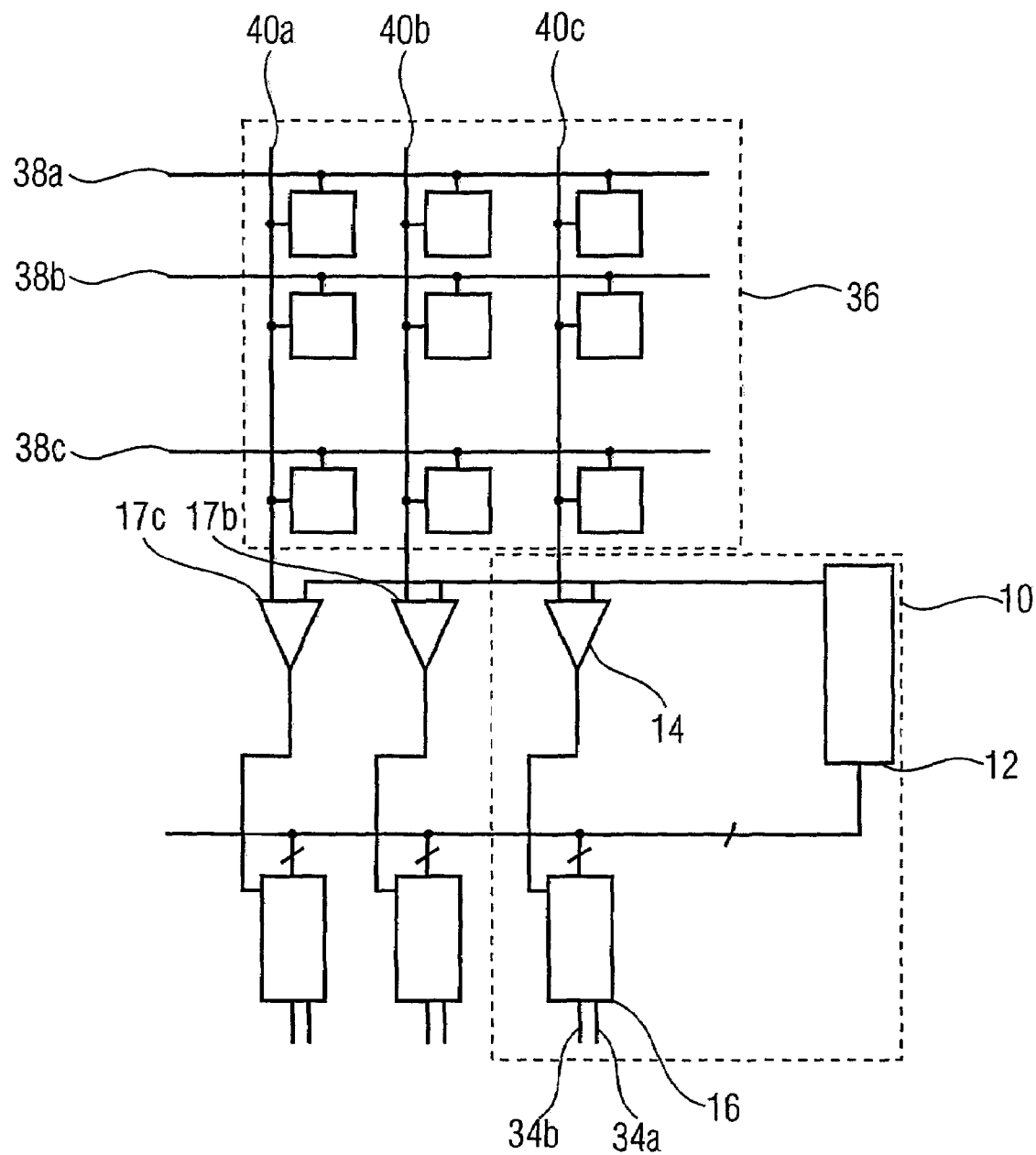
FIG. 2 shows a further embodiment of an inventive apparatus for sensing information of a multi-level storage cell.

FIG. 2 shows a further embodiment of the present invention and an example of a memory array to be readout using an inventive sense circuit 10. However, the functionality of the embodiment shown in FIG. 2 is similar to the functionality of the embodiment shown in FIG. 1. Therefore, identical or similar components are given the same reference numbers and the corresponding descriptions may also be applied to these components in the context of FIG. 2.

To be more specific, FIG. 2 shows a scenario with multi-level storage cells that are able to store four different states. Therefore, the output circuit 16 has a first and a second bit output 34a and 34b. Each bit-output can indicate two values, high or low. That is, four states can be signaled by the two bit outputs 34a and 34b. For example, bit output 34a may be used to signal the least significant bit and bit output 34b may be used to signal the most significant bit. FIG. 2 furthermore shows a schematic view of a memory cell array 36 with row-lines 38a-38c and column-lines 40a-40c.

The column-lines 40a-40c are additionally used as readout lines, transferring the state of the multi-level storage cells to the comparators. When, for example, reading out phase-change-memory, a current flowing through a memory cell (with adjustable resistivity) is detected. In that particular case, the signal ramp generator would be adapted to generate monotonously changing current values as reference states. When a storage technique is used, where different amounts of charge can be isolated within a multi-level storage cell, a voltage would be read out as a state of the memory cell and therefore, signal ramp generator 12 would be adapted to generate monotonously changing voltages as reference states.

Figure 6:
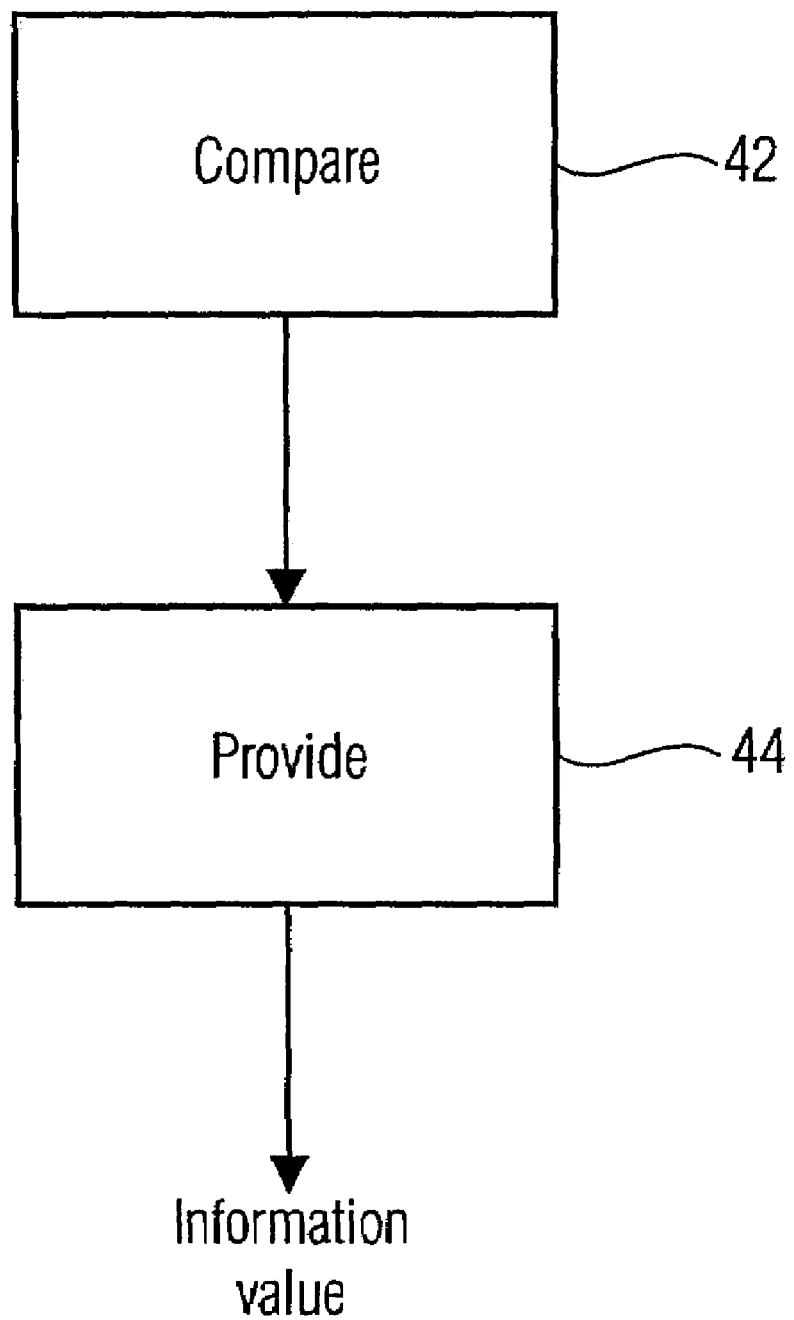
FIG. 6 shows an example for an inventive method for sensing information of a multi-level cell.

FIG. 6 shows an example for a method for sensing information stored as a state of a multi-level storage cell. As shown in FIG. 6, in a comparing step 42, reference states monotonously changing in a changing direction and having associated thereto different information values are compared with a state of a multi-level storage cell. In a providing step 44, that information value is provided as sensed information having associated therewith the reference state which, in the changing direction, firstly exceeds the state.

In the preceding paragraphs, comparators have mainly been used to detect an equivalency of the reference state and the state. More generally, a means for comparing the states could alternatively be any circuit or apparatus which allows to evaluate the equivalency of two quantities. This could, for example, be a simple discriminator, or other threshold-based deciding algorithms or circuits. Other possible alternatives are more complicated, comparing the shape of two signals or indicating an exceeding of the reference state when the reference state is within a tolerance range of the state or when the state and the reference state have similar shape within a shape tolerance range. Other means for comparing the signal known in the art or developed in the future may also be applied.

The output circuit or the means for providing information values previously described may also be substituted by any appropriate means for providing an information value. That is, analog signals may be provided, a counter may be implemented as the means for providing the information value directly or, for example, the means for providing may be implemented to switch externally provided information values to its output. Generally, every circuit providing values on occurrence of a comparator signal is suited.

The signal ramp generator may, as previously described, be implemented in various ways such as to, for example, provide voltages or currents. Furthermore, quantum mechanical states or wave functions may be provided or other quantities suited to describe a possible internal state of a multi-level storage cell. This could, for example, also be a magnetic moment, a polarization direction or a refractive pattern or the like.

Depending on certain implementation requirements of the inventive methods, the inventive methods can be implemented in hardware or in software. The implementation can be performed using a digital storage medium, in particular a disk, DVD or a CD having electronically or optically readable control signals stored thereon, which cooperate with a programmable computer system such that the inventive methods are performed. Generally, the present invention is, therefore, a computer program product with a program code stored on a machine readable carrier, the program code being operative for performing the inventive methods when the computer program product runs on a computer. In other words, the inventive methods are, therefore, a computer program having a program code for performing at least one of the inventive methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

What is claimed is:

1. A method for sensing information stored as a state of a multi-level storage cell having more than two possible states, the method comprising:

serially providing integer values having different discrete reference states associated therewith;

serially, per integer value provided, comparing the state with the discrete reference states associated with the respective integer value; and providing the sensed information based on that integer value having associated therewith the discrete reference state which, in serially comparing the state with the reference states, first exceeds the state.

2. The method of claim 1, wherein comparing the state with the discrete reference states comprises comparing voltage or current values representing the state and the discrete reference states.

3. The method of claim 1, wherein the discrete reference states are associated with the integer values such that the discrete reference states increase with increasing integer values.

4. The method according to claim 1, wherein the serially providing integer values comprises running a counter to provide the integer values with the discrete reference states being associated with the integer values such that the reference states monotonically change with increasing counter values.

5. An apparatus for sensing information stored as a state of a multi-level storage cell having more than two possible states, the apparatus comprising:

means for providing integer values having different discrete reference states associated therewith:

means for serially, per integer value provided, comparing the state with the discrete reference states associated with the respective integer value; and means for providing the sensed information based on that integer value having associated therewith the discrete reference state which, in serially comparing the state with the reference states, first exceeds the state.

6. The apparatus of claim 5, wherein the means for comparing comprises means for comparing voltage or current values representing the state and the reference states.

7. The apparatus of claim 5, wherein the discrete reference states are associated with the integer values such that the discrete reference states increase with increasing integer values.

8. The apparatus according to claim 5, wherein the means for serially providing integer values comprises a counter adapted to provide the integer values with the discrete reference states being associated with the integer values such that the reference states monotonically change with increasing counter values.

9. A sense circuit, comprising:

a provider adapted to provide integer values at an integer output;

a signal ramp generator coupled to the integer output and adapted to generate at a generator output thereof and per integer value, a respective discrete reference state associated to the respective integer value;

a comparator having a first input connectable to the cell and having a second input being coupled to the generator output, and being adapted to, per integer value, compare a state of a multi-level storage cell having more than two possible states with the discrete reference state associated with the respective integer value; and an output circuit adapted to output a sensed value based on that integer value which, in comparing the state with the discrete reference states, first exceeds the state.

10. The sense circuit of claim 9, wherein the signal ramp generator is adapted to generate voltage or current values as the reference states.

11. The sense circuit of claim 9, wherein the signal ramp generator is adapted to the discrete reference states such that the discrete reference states increase with increasing integer values.

12. The sense circuit according to claim 9, wherein the provider comprises a counter adapted to provide the integer values at the integer output with the discrete reference states being associated with the integer values such that the reference states monotonically change with increasing counter values.

* * * * *